US008790785B2

(12) United States Patent
Yamamoto et al.

(10) Patent No.: US 8,790,785 B2
(45) Date of Patent: Jul. 29, 2014

(54) METHOD OF FORMING A POROUS INSULATION FILM

(75) Inventors: Hironori Yamamoto, Tokyo (JP); Fuminori Ito, Tokyo (JP); Munehiro Tada, Tokyo (JP); Yoshihiro Hayashi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 899 days.

(21) Appl. No.: 12/374,390

(22) PCT Filed: Jul. 23, 2007

(86) PCT No.: PCT/JP2007/064407
§ 371 (c)(1),
(2), (4) Date: Mar. 26, 2009

(87) PCT Pub. No.: WO2008/010591
PCT Pub. Date: Jan. 24, 2008

(65) Prior Publication Data
US 2009/0246538 A1 Oct. 1, 2009

(30) Foreign Application Priority Data

Jul. 21, 2006 (JP) ................................. 2006-199273

(51) Int. Cl.
*B32B 9/00* (2006.01)
*H01L 21/312* (2006.01)
*C07F 7/21* (2006.01)

(52) U.S. Cl.
USPC ........ 428/447; 427/255.6; 427/503; 427/569; 427/574; 427/578; 438/780; 438/788; 438/789

(58) Field of Classification Search
USPC ................ 427/255.6, 503, 569, 574, 578; 428/447; 438/780, 788, 789
See application file for complete search history.

(56) References Cited

U.S. PATENT DOCUMENTS 7,968,471 B2 * 6/2011 Harada et al. ................. 438/780

FOREIGN PATENT DOCUMENTS

| JP | 10-032199 A | 2/1998 |
|---|---|---|
| JP | 11-087340 A | 3/1999 |
| JP | 2002-526916 A | 8/2002 |
| JP | 2004-047873 A | 2/2004 |
| JP | 2004-289105 A | 10/2004 |
| WO | 03-019645 A | 3/2003 |
| WO | 2005-053009 A | 6/2005 |

OTHER PUBLICATIONS

International Search Report for PCT/JP2007/064407 mailed Sep. 18, 2007.
Yoshihiro Hayashi, Fuminori Ito, Tsuneo Takeuchi, Shinobu Saito, Munehiro Tada, Hiroto Ota, "Pore Structure-control of PECVD-derived SiOCH Film for Advanced ASICs", Proceedings of the Symposium on Semiconductors and Integrated Circuits Technology, Dec. 9, 2004, vol. 67th, pp. 22 to 25.

* cited by examiner

*Primary Examiner* — D. S. Nakarani
(74) *Attorney, Agent, or Firm* — Sughrue Mion, PLLC

(57) ABSTRACT

A method of forming a porous insulation film uses an organic silica material gas having a 3-membered SiO cyclic structure and a 4-membered SiO cyclic structure, or an organic silica material gas having a 3-membered SiO cyclic structure and a straight-chain organic silica structure, and uses a plasma reaction in the filming process. A porous interlevel dielectric film having a higher strength and a higher adhesive property can be obtained.

20 Claims, 5 Drawing Sheets

1 : film of material having a 3-membered SiO structure(C.Ex;1)
2 : film of material having 3-membered SiO structure and 4-membered SiO structure
3 : film of material having 4-membered SiO structure(C.Ex;2)

METHOD OF FORMING A POROUS INSULATION FILM

This application is the National Phase of PCT/JP2007/064407, filed Jul. 23, 2007, which claims priority to Japanese Patent Application No. 2006-199273, filed on Jul. 21, 2006, the disclosure of which is incorporated herein in its entirety by reference.

TECHNICAL FIELD

The present invention relates to a method of forming a porous insulation film and, more particularly, to a method of forming a porous insulation film capable of being used in a semiconductor device having a damascene interconnection structure including Cu as a main component thereof.

BACKGROUND ART

In a silicon semiconductor integrated circuit (LSI), aluminum (Al) or Al alloy has been widely used as an electric conducting material. Along with development of finer patterning processing of the LSIs, copper (Cu) has come to be used as the electric conducting material, in order for achieving a reduction in the line resistance of the interconnections as well as a higher reliability thereof. Since Cu is likely to be diffused into a silicon oxide film, a conductive barrier metal film for preventing the diffusion of Cu has been used on the side surface and bottom surface of the Cu interconnections, whereas an insulating barrier film has been used on the top surface of the Cu interconnections.

Along with the recent development of the finer patterning in the LSIs, the dimension of the interconnections has been further reduced, thereby raising the problem of an increase in the inter-line capacitance. This led to development of introduction of a porous low-dielectric-constant film among the interlevel dielectric films. This is because the finer patterning as well as the lower dielectric constant of the interlevel dielectric film obtained by using a multilayer interconnection structure in the semiconductor device is effective to connection with a higher speed and a lower power consumption, and thus it is desired to achieve both the finer patterning and lower dielectric constant.

For achieving the lower dielectric constant for the interlayer dielectric film, a technique of raising the porosity of the film property by inserting and extracting porogen as well as introduction of hydrocarbon has been tried. Examples of the lower-dielectric-constant film include a hydrogen silsesquioxane film, a CDO (carbon-doped oxide) film, and an organic film. These films are formed using a spin-coating or chemical vapor deposition technique. Patent Publication JP-2004-289105A describes a technique of forming a porous insulation film by using a plasma-enhanced CVD technique. Republished Patent Publication JP-2002-526916A describes a method for forming a porous insulation film by using cyclic organic siloxane.

The present inventor considered the conventional techniques in the following way. If the technique described in JP-2004-289105A is used, since this uses a cut-and-couplingtype filming process wherein the monomer material is decomposed in plasma, the hydrocarbon component coupled to the monomer material is desorbed, thereby causing the problem that the relative permittivity is not lowered. In the technique described in Republished Patent Publication 2002-526916A and using cyclic siloxane monomer material, the cyclic structure of siloxane configures the skeletal frame thereof, which provides a relative permittivity of about 2.6. In addition, the siloxane including isopropyl group in a side chain causes a steric constraint, and if a vinyl group is included in a side chain thereof, it accelerates addition reaction of the monomer, to thereby provide a relative permittivity of about 2.5. However, there is a problem in the film strength thereof.

Further, along with the development of lower dielectric constant of the film, the porosity of the film increases, an thus results in a further reduction in the film strength. The reduction in the film strength accompanies reduction in the adhesive property between films to thereby degrade the device reliability.

SUMMARY OF THE INVENTION

Thus, it is an object of the present invention to provide a method of forming an insulation film by using a siloxane monomer material, which is capable of forming the insulation film at a higher filming rate. It is also an object of the present invention to provide an insulation film formed by the above method of forming the insulation film and a semiconductor device including the insulation film.

The present invention provides, in a first aspect thereof, a method of forming an insulation film, the method using plasma reaction of a plurality of species of material gas each having a cyclic organic silica structure to form an organic silica film, wherein the materials include a material having in a main skeletal frame thereof a 3-membered SiO cyclic structure and another material having in a main skeletal frame thereof a 4-membered SiO cyclic structure, and wherein at least one of the materials has at least one unsaturated hydrocarbon group on a side chain thereof.

The present invention provides, in a second aspect thereof, a method of forming an insulation film, the method using plasma reaction of at least one species of material gas having a cyclic organic silica structure and at least one species of material gas having a straight-chain organic silica structure to form an organic silica film, wherein the material having the organic cyclic silica structure has a 3-membered SiO cyclic structure in a skeletal frame thereof, the material having the straight-chain organic silica structure has an elemental ratio of $H/C \geq 1.6$, $C/Si \geq 5$ and $H/Si \geq 8$, and these materials have at least one unsaturated hydrocarbon group on a side chain thereof.

The above and other objects, features and advantages of the present invention will be more apparent from the following description, referring to the accompanying drawings.

BEST MODES OF CARRYING OUT THE INVENTION

Figure 1A:
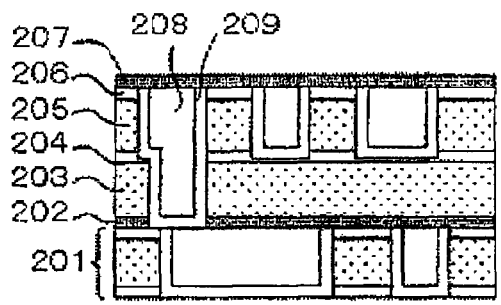
FIGS. 1A and 1B are sectional views respectively showing a conventional damascene structure and an interconnection structure capable of reducing the effective relative permittivity.

Before describing the present invention in detail, the definition in the text of the present application will be described. A low-dielectric-constant insulation film is, for example, a film (interlayer dielectric film) that performs insulation-isolation between interconnection members, and refers to a material having a lower relative permittivity than a silicon oxide film (having a relative permittivity of 4.2) in order to reduce the capacitance between multilevel interconnection layers that connect semiconductor elements. In particular, examples of the porous insulation film include a material obtained by porosity treatment of a silicon oxide film to have a lower relative permittivity, and a material obtained by porosity treatment of a HSQ (hydrogen silsesquioxane) film, or a SiOCH or SiOC (for example, black diamond™, CORAL™, aurora™) film to have a lower relative permittivity. It is desired that these films have a further lower dielectric constant.

Metallic interconnection material refers to a metallic wiring material including Cu as a main component thereof. In order for improving the reliability of the metallic interconnection material, a metallic element other than Cu may be included in a Cu member, and a metallic element other than Cu may be formed on the top surface or side surface of Cu.

Damascene interconnection refers to an embedded interconnection that is formed by embedding a metallic material in a groove of an interlevel dielectric film formed in advance and removing the excessive metal disposed outside the internal of the groove as by CMP. For forming the damascene interconnection by using Cu, an interconnection structure is generally used wherein the side surface and periphery of the Cu interconnection is covered by a barrier metal and the top surface of the Cu interconnection is covered by an insulative barrier film.

CMP (chemical mechanical polishing) technique refers to a technique of planarizing the unevenness of the surface of a wafer caused by a process of forming the multilevel interconnection layers, by contacting the same with a rotating polishing pad while flowing a polishing liquid on the wafer surface. In the forming of interconnections by using the damascene technique in particular, the CMP is used for removing the excessive portion of the metal to obtain a flat surface of the interconnections after embedding the metal within the wiring groove or via-holes.

Barrier metal refers to a conductive film having a barrier function and covering the side surface and bottom surface of the interconnections for preventing the metal element configuring the interconnections from diffusing toward the interlevel dielectric film or underlying layer. For example, if the interconnections are configured by metal elements including Cu as a main component, a high-melting-point metal or nitride thereof, such as tantalum (Ta), tantalum nitride (TaN), titanium nitride (TiN), and tungsten carbonitride (WCN), or a film stack thereof may be used as the barrier metal.

Insulating barrier film is formed on the top surface of Cu interconnections, and has a function of preventing oxidation of Cu and diffusion of Cu into the insulation film and a role of an etch stop layer during the patterning. For example, SiC film, SiCN film, SiN film etc. are used therefor.

Semiconductor substrate refers to a substrate on which a semiconductor device is formed, and examples thereof include a SOI (silicon on insulator) substrate, and a TFT substrate used for manufacturing a LCD unit, in addition to a single-crystal-silicon substrate.

Hard mask refers to an insulation film stacked onto an interlevel dielectric film for protection thereof in the case where the interlevel dielectric film has a reduced strength due to the treatment for lowering the dielectric constant thereof and thus it is difficult to use the direct CMP thereto.

Passivation film is formed as a topmost layer overlying semiconductor elements and has a role of protecting the semiconductor elements against external water. In the present invention, a silicon oxynitride film (SiON) or polyimide film formed by a plasma-enhanced CVD technique is used therefor.

The plasma-enhanced CVD technique refers to a technique used for forming a continuous film on a substrate with a gas phase reaction or a substrate-surface reaction by continuously supplying a gaseous material into a reaction chamber under a reduced pressure and using a plasma energy to excite the molecules thereof.

PVD technique may use an ordinary sputtering technique, and may also use a high-directional sputtering technique, such as long-throw sputtering technique, collimated sputtering technique, and ionized sputtering technique, in order for improving the embedding property, improving the film property, and raising the within-wafer uniformity of the film thickness. For sputtering an alloy, the alloy film may be configured by a metallic film formed by allowing a metallic target to include a metal other than the main component thereof in advance at a rate of lower than the solid-solution limit thereof. In the present invention, this technique may be used for forming a Cu seed film or barrier metal film in the process for forming Cu damascene interconnections.

A preferable method of forming an insulation film according to a first aspect of the present invention is directed to a process for forming an organic silica film by using plasma reaction of two or more species of material gas having a cyclic organic silica structure, wherein the material gases include one having, in the main skeletal frame thereof, a 3-membered SiO-cyclic structure and another having, in the main skeletal frame thereof, a 4-membered SiO-cyclic structure, and one of these species has at least one unsaturated hydrocarbon group on a side chain thereof.

A preferable method of forming an insulation film according to a second aspect of the present invention is directed to a process for forming an organic silica film by using plasma reaction of at least one species of material gas having a cyclic organic silica structure and at lest one species of material gas having a straight-chain organic silica structure, wherein the material having the cyclic organic silica structure has, in the main skeletal frame thereof, a 3-membered SiO-cyclic structure and the material having the straight-chain organic silica structure has an elemental ratio of $H/C \geq 1.6$, $C/Si \geq 5$, and $H/Si \geq 8$, and these materials each have at least one unsaturated hydrocarbon group on the side chain thereof.

In the method of forming the insulation film of the present invention, the materials having a silica structure are preferably vaporized in different carburetors and then introduced into a reaction chamber. Otherwise, the materials having a silica structure are preferably vaporized in the same carburetor and then introduced into a reaction chamber. The organic silica materials may be such that the cyclic organic silica compound may preferably have the structure expressed by the formula 1, wherein R1 and R2 each are an unsaturated carbon compound or a saturated carbon compound, and may be a vinyl group, allyl group, methyl group ethyl group, propyl group, isopropyl group, or butyl group. In particular, R1 may be preferably an unsaturated carbon compound, and R2 is preferably a saturated carbon compound. R1 is preferably a vinyl group or allyl group, and R2 is preferably one of methyl group, ethyl group, propyl group, isopropyl group and butyl group.

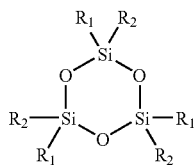

[Formula 1]

The cyclic organic silica compound may preferably include at least one of the compounds having the structure expressed by the following formulas 2, 3, 4, and 5.

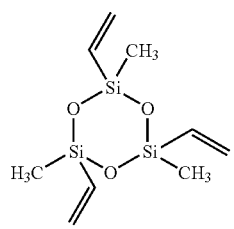

[Formula 2]

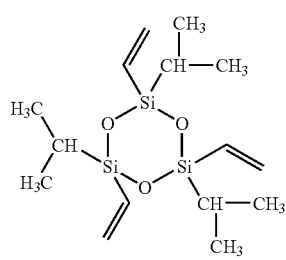

[Formula 3]

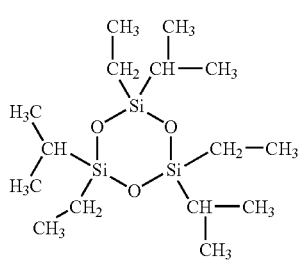

[Formula 4]

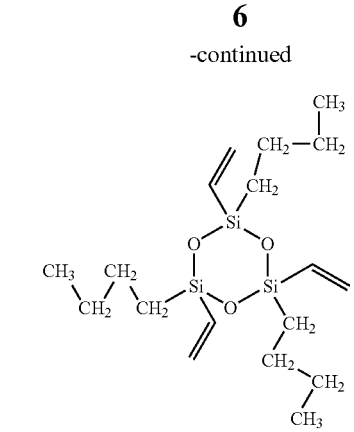

[Formula 5]

The cyclic organic silica compound preferably has the structure expressed by the following formula 6, wherein R3 and R4 each are preferably an unsaturated carbon compound, saturated carbon compound or hydrogen, and may be preferably hydrogen, vinyl group, allyl group, methylvinyl group, methyl group, ethyl group, propyl group, isopropyl group, or butyl group. In particular, R3 is preferably an unsaturated carbon compound, and R4 is preferably a saturated carbon compound or hydrogen. R3 may be a vinyl group, allyl group, or methylvinyl group, and R4 may be any one of hydrogen, methyl group, ethyl group, propyl group, isopropyl group and butyl group.

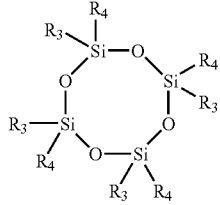

[Formula 6]

The cyclic organic silica compounds each are preferably one of the compounds having the structure expressed by the following formulas 7, 8, 9, and 10.

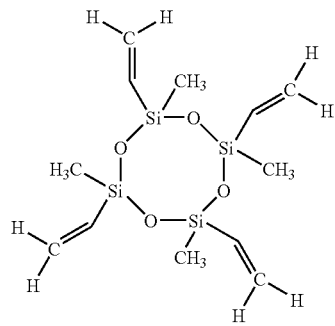

[Formula 7]

-continued

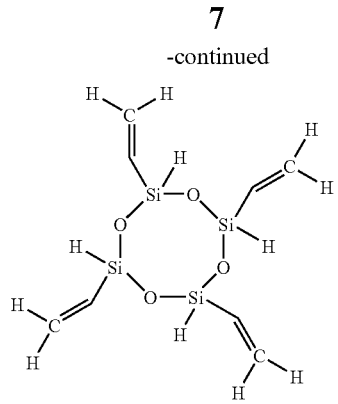
[Formula 8]

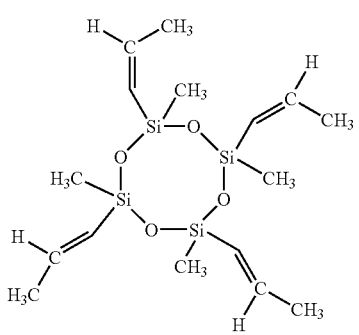
[Formula 9]

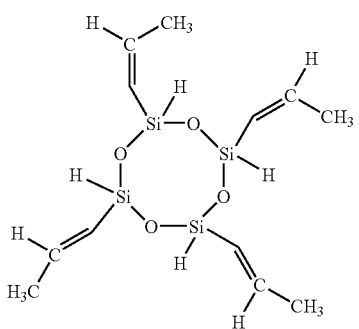
[Formula 10]

In addition, the straight-chain organic silica compound preferably has the structure expressed by the following formula 11, wherein R5 is a saturated carbon compound, and R6, R7 and R8 each are an unsaturated carbon compound. R5 is preferably a vinyl group or allyl group, and R6, R7 and R8 each are preferably a methyl group, ethyl group, propyl group, isopropyl group, or butyl group.

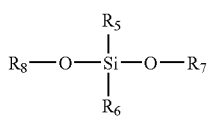
[Formula 11]

The straight-chain organic silica compound may be preferably a compound having the structure expressed by the following formula 12.

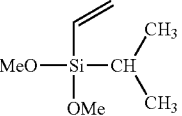
[Formula 12]

The insulation film formed by the above method of forming the insulation film may preferably include at least amorphous carbon. The amorphous carbon included in the insulation film preferably has both a Sp2 structure and a Sp3 structure.

A semiconductor device including the above insulation films preferably include two or more layers formed by employing different composition ratios of the materials having the above organic silica structure.

Use of the method of forming the porous insulation film, and use of the insulation film and semiconductor device according to the present invention achieves a lower dielectric constant for the interlevel dielectric film and thus improves the property of the insulation film, thereby providing a LSI having a higher-speed operation and a lower-power consumption.

Hereinafter, the cyclic organic silica compound (siloxane) material and the straight-chain organic silica compound (siloxane) material which may be used in the method of the present invention will be described.

The organic siloxane material is a compound expressed by the formula 1, 6, or 11. Examples of the alkyl groups R1-R8 in the formulas 1, 6 and 11 include hydrogen, methyl group, ethyl group, propyl group, isopropyl group, vinyl group, allyl group, methylvinyl group, butyl group, etc.

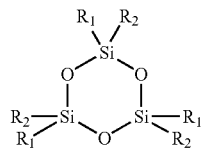
[Formula 1]

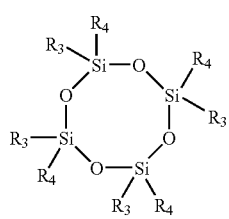
[Formula 6]

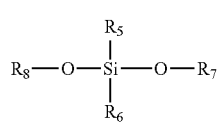
[Formula 11]

(First Exemplary Embodiment)

An insulation film preferably used as an interlevel dielectric film can be formed using the present invention by plasma-enhanced vapor phase epitaxy wherein at least one species of organic siloxane material is fed into a reaction chamber Hereinafter, an exemplified first embodiment for forming an insulation film by feeding a vaporized material to the chamber will be described with reference to FIGS. 2A and 2B.

Figure 2A:
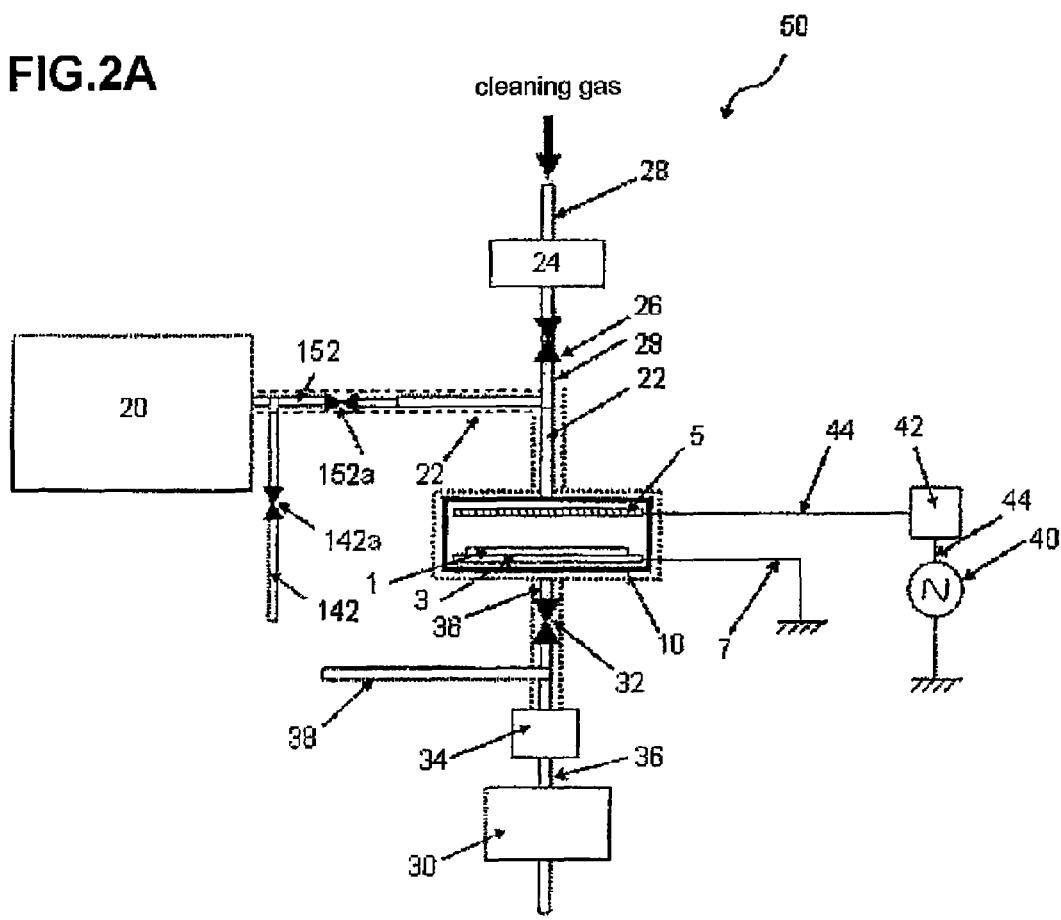
FIG. 2A is a diagram schematically showing a film deposition system for a porous insulation film used in the method of the present invention.

FIG. 2A is a schematic diagram showing an example of the plasma-enhanced CVD system which can be used for forming (depositing) a porous insulation film according to the method of the present invention. The plasma-enhanced CVD system 50 shown in the same figure includes a reaction chamber 10, a gas feed section 20, a vacuum pump 30, and a high-frequency-power supply unit 40. The gas feed section 20 is coupled to the reaction chamber 10 by means of a gas feed tube 22, and the vacuum pump 30 is coupled to the reaction chamber 10 by means of a gas exhaust tube 36 along which a valve 32 and a cooling trap 34 are provided. The high-frequency-power supply unit 40 is connected to the reaction chamber 10 by means of a high-frequency cable 44 along which a matching box 42 is disposed.

In the reaction chamber 10, a substrate heating member 3 that supports thereon and heats a film-to-be-formed member 1, such as a semiconductor substrate, and a showerhead 5 coupled to an end of the gas feed tube 22 to function as a gas blow member are disposed to oppose each other. A ground line 7 is connected to the substrate heating member 3, and the high-frequency cable 44 is connected to the showerhead 5. Thus, the material gas etc. are fed to the showerhead 5 via the gas feed tube 22 from the gas feed section 20, and the high-frequency power generated by the high-frequency-power supply unit 40 is supplied to the showerhead 5 after converting the same into a specified frequency by using the matching box 42 that is disposed along the high-frequency cable 44, thereby forming plasma in the gas within the space between the substrate heating member 3 and the showerhead 5.

A cleaning-gas feed tube 28 along which a flow controller 24 and a valve 26 are arranged is coupled to the gas feed tube 22, and a waste-fluid tube 38 branches from the gas exhaust tube 36 between the valve 32 and the cooling trap 34. It is preferred to provide a heater (not shown) on the circumference of the gas feed tube 22 for heating the gas feed tube 22, in order to prevent each gas from being liquefied during the feed thereof. Similarly, the circumference of the reaction chamber 10 is preferably provided with a heater (not shown) for heating the reaction chamber 10.

Figure 2B:
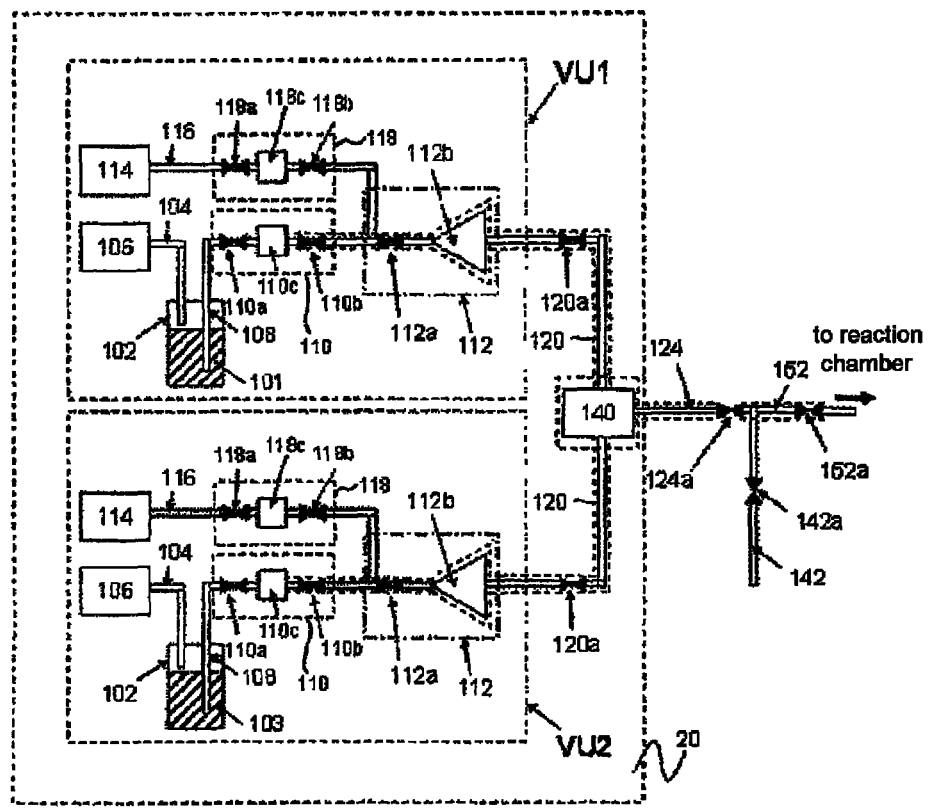
FIG. 2B is a schematic diagram showing part of the film deposition system of FIG. 2A.

FIG. 2B shows the internal of the gas feed section 20. Evaporation control units VU1 and VU2 each include a feedstock tank 102 that receives therein a liquid cyclic organic siloxane materials 101, 103, a pressure-feed gas feed unit 106 that feeds pressure-feed gas to the feedstock tank 102 via a pressure-feed gas feed tube 104, a material transfer tube 108 having an end inserted into the feedstock tank 102, a liquid-flow-rate control section 110 provided along the material transfer tube 108, and a carburetion member 112 arranged at the other end of the material transfer tube 108. The above liquid-flow-rate control section 110 includes two valves 110a and 110b, and a liquid-flow-rate controller 110c arranged between the vales 110a and 110b, whereas the carburetion member 112 includes a valve 112a provided on the other end of the material transfer tube 108, and a carburetor 112b connected to the above other end of material transfer tube 108.

Each of the evaporation control units VU1 and VU2 includes a gas feed tank 114 (hereinafter referred to as "carrier-gas feed tank 114") for receiving carrier gas or diluted gas, a tube 116 that feeds the carrier gas or diluted gas received in the carrier-gas feed tank 114 to the material-compound transfer tube 108 between the liquid-flow-rate control section 110 and the carburetion member 112. A gas-flow-rate control section 118 including two valves 118a, 118b and a gas-flow controller 118c is provided along the tube 116.

In evaporation control unit VU1, when the pressure-feed gas is fed to the feedstock tank 102 via the pressure-feed gas feed tube 104 from the pressure-feed gas feed unit 106, the internal pressure of the feedstock tank 102 is raised, whereby the liquid first organic siloxane material 101 received in the feedstock tank 102 is transferred toward the carburetion member 112 via the material transfer tube 108, and flows together with the carrier gas or diluted gas that is joined on the way to reach the carburetion member 112. The liquid cyclic organic siloxane material 101 that reaches the carburetion member 112 is evaporated due to a reduced pressure at the inlet of the carburetion member 112 and the heat by a heater (not shown).

Similarly, in evaporation control unit VU2, when the pressure-feed gas is fed to the feedstock tank 102 via the pressure-feed gas feed tube 104 from the pressure-feed gas feed unit 106, the internal pressure of the feedstock tank 102 is raised, whereby the liquid second organic siloxane material 103 received in the feedstock tank 102 is transferred toward the carburetion member 112 via the material transfer tube 108, and flows together with the carrier gas or diluted gas that is joined on the way to reach the carburetion member 112. The liquid cyclic organic siloxane material 101 that reaches the carburetion member 112 is evaporated due to a reduced pressure at the inlet of the carburetion member 112 and the heat by a heater (not shown).

In an alternative, a plurality of species of the organic silica material may be introduced into the feedstock tack 102 of evaporation control unit VU1, to thereby evaporate them simultaneously in the carburetion member 112 of evaporation control unit VU1 without using evaporation control unit VU2.

In order to perform the evaporation in each carburetor 112b smoothly, it is preferred to provide a heater on the circumference of the material-compound transfer tube 108 at the downstream of the valve 110c in the liquid-flow-rate control section 110, and thereby warm the material-compound transfer tube 108. Similarly, in order to prevent liquefaction of each gas, it is preferred to provide a heater also on the circumference of each gas exhaust tube 120, 124, 152 and the mixer 140, to warm those members.

Upon forming an organic-silicon-series film by using the plasma-enhanced CVD system 50, the film-to-be-formed member 1, such as a semiconductor substrate, is first disposed on the substrate heating member 3, and thereafter, the vacuum pump 30 is operated with the valve 32 being open, to make the initial degree of vacuum in the reaction chamber 10 down to several Torr. The moisture in the gas discharged from the reaction chamber 10 is removed by a cooling trap 34. Subsequently, the material gas (evaporated cyclic organic siloxane gas) is fed to the reaction chamber 10 together with the carrier gas or diluted gas from the gas feed section 20, and simultaneously the high-frequency-power supply unit 40 and matching box 42 are operated, to supply the high frequency electric power of a specific frequency to the reaction chamber 10.

At this stage, each gas is controlled at the flow rate thereof by the corresponding flow-rate control section 110, 118, turns into a mixed gas having a specific composition in the mixer 140, and is then supplied to the reaction chamber 10. The partial pressure of the material gas in the reaction chamber 10 is suitably selected within the range of around 0.1 to 3 Torr. The ambient pressure in the reaction chamber 10 during the filming process is suitably set within the range of around 1 to 6 Torr by the control of operation of the vacuum pump 30. The surface temperature of the film-to-be-formed member 1 during the filming process can be suitably set within the range of 100 to 400° C., and more preferably within the range of 250 to 350° C., while heating the film-to-be-formed member 1 by using the substrate heating member 3. As described before, some material compounds are fed to the reaction chamber 10 prior to feeding the material gas, depending on the species thereof.

In the filming process under the above conditions, molecules of the cyclic organic siloxane material that constitute the material gas are excited by plasma, reach the surface of the film-to-be-formed member 1 in the activated state, and configures an insulation film thereon. The molecules of the organic silicon compound excited and activated by the plasma reach the surface of the film-to-be-formed member 1 to receive thermal energy from the substrate heating member 3. Thus, if the insulation film includes a group having an unsaturated bond, the unsaturated bond existing in the group is subjected to ring-opening to induce a thermal polymerization reaction between molecules and thus grow the insulation film.

Upon cleaning of the reaction chamber 10, gases such as nitrogen trifluoride ($NF_3$), sulfur hexafluoride ($SF_6$), tetrafluoromethane ($CF_4$) and hexafluoroethane ($C_2F_6$), may be used, and these gases may be used as a mixed gas mixed with oxygen gas, ozone gas etc., if needed. The cleaning gas is fed to the reaction chamber 10 via a cleaning-gas feed tube 28. Similarly to the filming process, a high-frequency electric power is applied between the showerhead 5 and the substrate heating member 3, to induce the plasma in the reaction chamber 10 for cleaning thereof. It is also effective to use the cleaning gas in the state of plasma induced in advance by using remote plasma etc.

In the present embodiment, filming was performed using a material having a 3-membered SiO cyclic structure in the feedstock tank 102 of evaporation control unit VU1, and another material having a 4-membered SiO cyclic structure in the feedstock tank 102 of evaporation control unit VU2.

In the following examples, measurement of the k-value used a mercury probe, measurement of the film strength used a nano indenter, measurement of the pore size used a minor-angle X-ray measurement, and measurement of the film structure and composition used a FTIR-Raman spectrometry.

EXAMPLE-1

The filming process used, as the first organic siloxane material 101, the material expressed by formula 1 (formula 3) wherein R1 is a vinyl group and R2 is an isopropyl group, and used, as the second organic siloxane group, the material expressed by formula 6 (formula 7) wherein R3 is a vinyl group and R4 is a methyl group. The material ratio (molar ratio) of the first organic siloxane material to the second organic siloxane material was 1:9 to 9:1.

Figure 3:
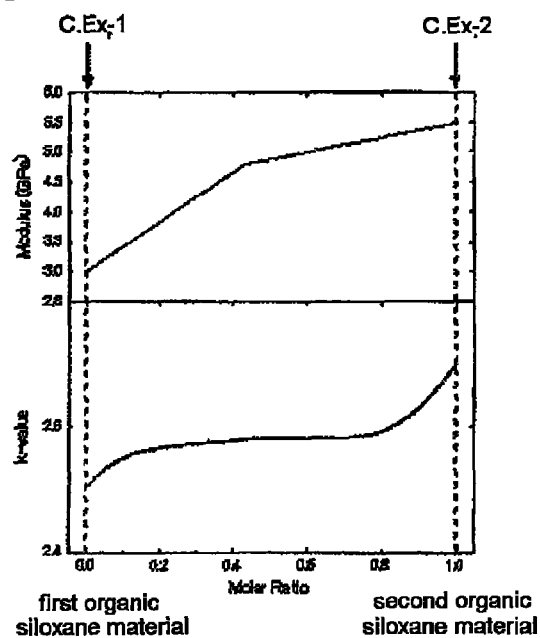
FIG. 3 is a graph showing the k-value versus the strength of the films according to a first exemplary embodiment and comparative examples-1 and -2.

FIG. 3 is a diagram showing the change of film strength (modulus (GPa)) and k-value with respect to the molar ratio of the second organic siloxane material to the sum of the first and second organic siloxane materials. The "0" of the abscissa represents the property of the film formed only from the first organic siloxane material, whereas the "1" on the abscissa represents the characteristic of the film formed only from the second organic siloxane material. It was revealed that, with respect to the change of k-value and the change of film strength both from those of the first organic siloxane material, the k-value scarcely changes whereas the film strength monotonically increases, in the range of material ratio between 1:9 and 8:2 (or in the range of molar ratio between 0.1 and 0.8 as defined in FIG. 3).

Figure 4:
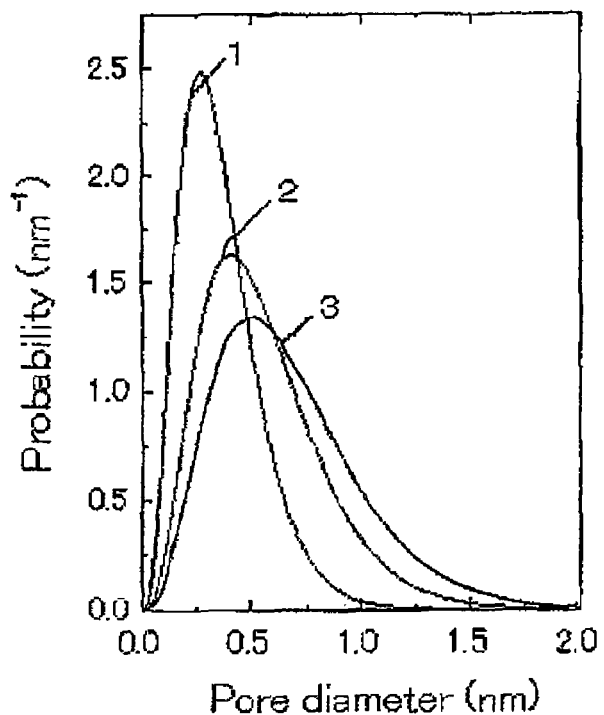
FIG. 4 is a graph showing the pore size versus distribution thereof in the first exemplary embodiment and comparative examples-1 and -2.

FIG. 4 shows a pore size distribution wherein the case of source material having only a 3-membered SiO cyclic structure constituting the first organic siloxane material reveals a sharp pore distribution, whereas the case of source material having a 4-membered SiO cyclic structure constituting the second organic siloxane material reveals a larger pore size and a broader distribution toward the larger pore size.

Figure 5:
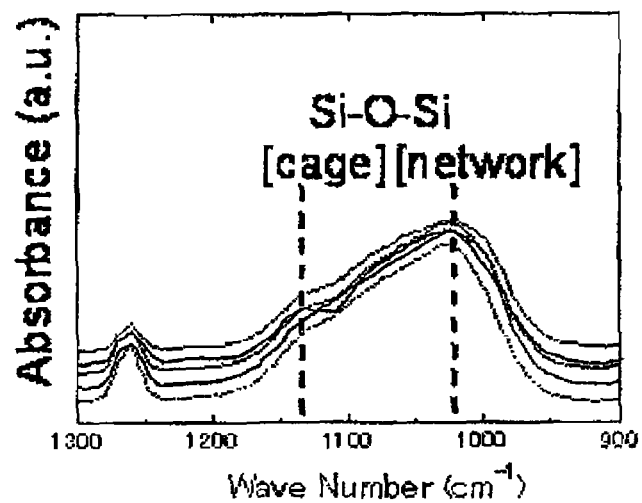
FIG. 5 is a graph showing an example of the results of FTIR spectrometry of Si—O—Si bond of the film manufactured in the first exemplary embodiment.
Figure 6:
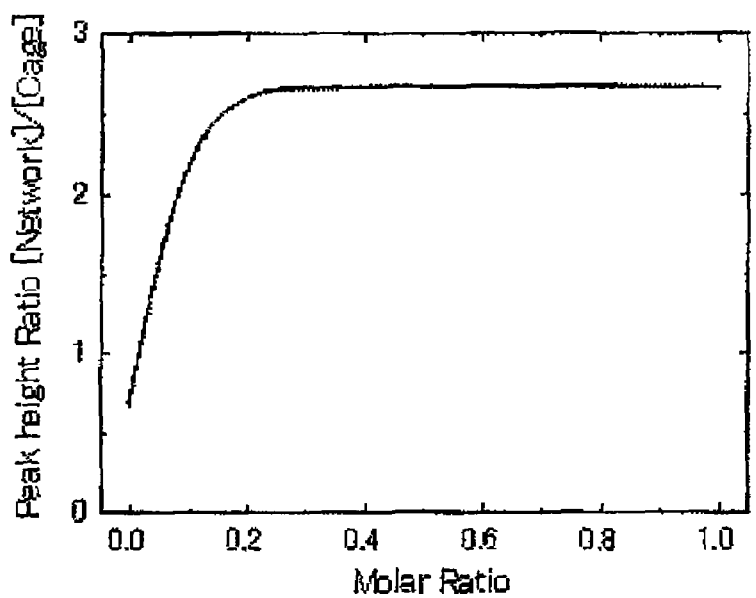
FIG. 6 is a graph showing the FTIR peak strength ratio of the network structure to the cage structure of the Si—O—Si bond in the first exemplary embodiment.

FIG. 5 shows the peaks of Si—O—Si bond of the organic siloxane film measured in the Raman spectrometry, wherein the peaks can be separated into a cage-type bond in the higher wave number side and a network-type bond in the lower wave number side. FIG. 6 shows the ratio of the peak height of Si—O—Si cage-type bond to the peak height of the Si—O—Si network-type bond, measured by the Raman spectroscopy, versus the molar ratio of the second organic siloxane material to the sum of the first and second organic siloxane materials, similarly to FIG. 3. These results reveal that addition of the material having a 4-membered SiO cyclic structure and constituting the second organic siloxane material increases the number of network-type Si—O—Si structures. From the results shown in FIGS. 5 and 6 it is probable that the material having a 4-membered SiO cyclic structure increases the film strength due to formation of the network structure because part of the cyclic structure is subjected to ring-opening that causes crosslink of the of Si—O—Si bonds. It is probable that the 3-membered SiO structure is planar whereas the 4-membered SiO structure is not planar wherein the Si and O do not exist on the same plane, whereby the material having the 4-membered SiO structure is more likely subjected to the ring-opening compared to the material having the 3-membered SiO structure.

EXAMPLE-2

The filming process used, as the first organic siloxane material 101, the material expressed by formula 1, wherein R1 is a vinyl group and R2 is an ethyl group, and used, as the second organic siloxane material 103, the material expressed by formula 6 (formula 7) wherein R3 is a vinyl group and R4 is a methyl group. The material ratio (molar ratio) of the first organic siloxane material 101 to the second organic siloxane was 8:2.

EXAMPLE-3

The filming process used, as the first organic siloxane material 101, the material expressed by formula 1 (formula 4), wherein R1 is an ethyl group and R2 is an isopropyl group, and used, as the second organic siloxane material 103, the material expressed by formula 6 (formula 7) wherein R3 is a vinyl group and R4 is a methyl group. The material ratio (molar ratio) of the first organic siloxane material 101 to the second organic siloxane was 7:3.

EXAMPLE-4

The filming process used, as the first organic siloxane material 101, the material expressed by formula 1 (formula 5), wherein R1 is a vinyl group and R2 is an n-butyl group, and used, as the second organic siloxane material 103, the material expressed by formula 6 (formula 7) wherein R3 is a vinyl group and R4 is a methyl group. The material ratio (molar ratio) of the first organic siloxane material 101 to the second organic siloxane was 6:4.

EXAMPLE-5

The filming process used, as the first organic siloxane material 101, the material expressed by formula 1 (formula 3), wherein R1 is a vinyl group and R2 is an isopropyl group, and used, as the second organic siloxane material 103, the material expressed by formula 6 (formula 8) wherein R3 is a vinyl group and R4 is hydrogen. The material ratio (molar ratio) of the first organic siloxane material 101 to the second organic siloxane was 5:5.

EXAMPLE-6

The filming process used, as the first organic siloxane material 101, the material expressed by formula 1 (formula 3), wherein R1 is a vinyl group and R2 is an isopropyl group, and used, as the second organic siloxane material 103, the material expressed by formula 6 (formula 10) wherein R3 is a methylvinyl group and R4 is hydrogen. The material ratio (molar ratio) of the first organic siloxane material 101 to the second organic siloxane was 3:7.

EXAMPLE-7

The filming process used, as the first organic siloxane material 101, the material expressed by formula 1 (formula 3), wherein R1 is a vinyl group and R2 is an isopropyl group, and used, as the second organic siloxane material 103, the material expressed by formula 6 (formula 9) wherein R3 is a methylvinyl group and R4 is a methyl group. The material ratio (molar ratio) of the first organic siloxane material 101 to the second organic siloxane was 1:9.

COMPARATIVE EXAMPLE-1

The filming process used only, as the first organic siloxane material 101, the material expressed by formula 1 (formula 3), wherein R1 is a vinyl group and R2 is an isopropyl group.

COMPARATIVE EXAMPLE-2

The filming process used, as the first organic siloxane material 101, only the material expressed by formula 6 (formula 7), wherein R1 is a vinyl group and R2 is a methyl group.

Table 1 shows the results of example-1 to example-7 and comparative examples-1 and -2. Comparing Table 1 against FIG. 3, the filming process in the comparative example-1, which used only the material having a 3-membered SiO cyclic structure in the filming process achieved a lower k-value and yet a film strength as low as 3 GPa. On the other hand, it is revealed that the filming process in the comparative example-2 achieved a higher film strength and yet a higher k-value. In Table 1, Δk and Δmodulus are values that are increased from those of the filming process (in the comparative example-1) using only the first organic siloxane material 101.

EXAMPLE-8

The filming process used, as the first organic siloxane material 101, the material expressed by formula 1 (formula 3) wherein R1 is a vinyl group and R2 is an isopropyl group, and used, as the second organic siloxane 103, the material expressed by formula 11 (formula 12) wherein R5 is a vinyl group, R6 is an isopropyl group, and R7 and R8 are a methyl group. The ratio (molar ratio) of the first organic siloxane material to the second organic siloxane material was 1:9 to 9:1.

Figure 7:
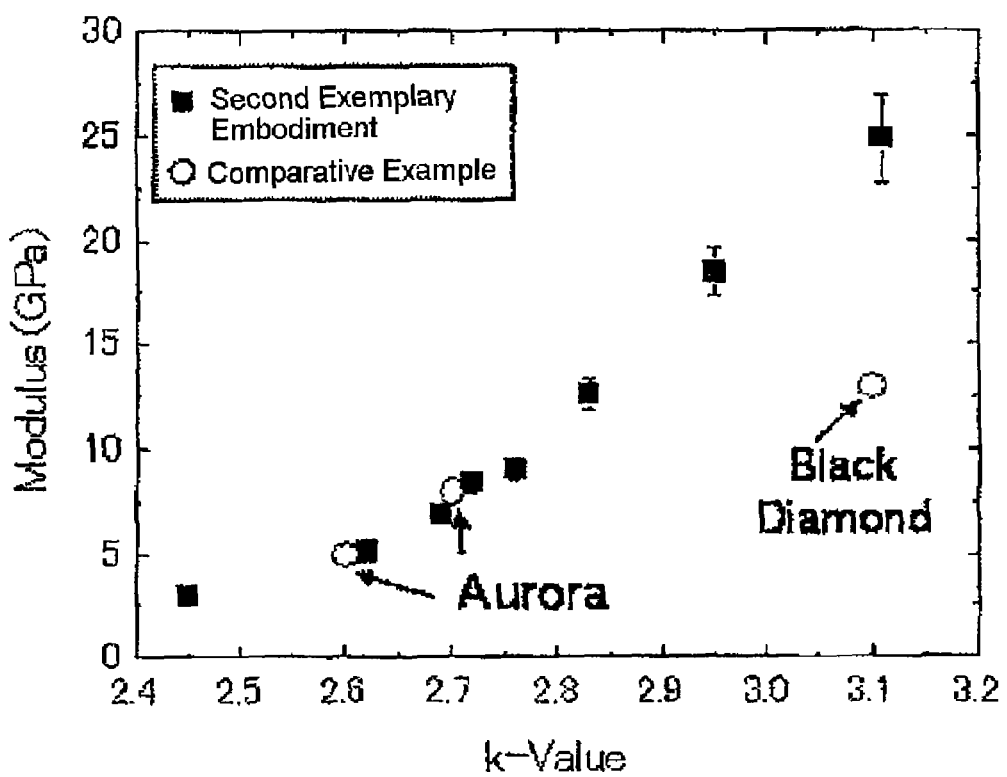
FIG. 7 is a graph showing the relationship of the k-value versus the strength of films according to a second exemplary embodiment and comparative examples-1 and -2.
Figure 8:
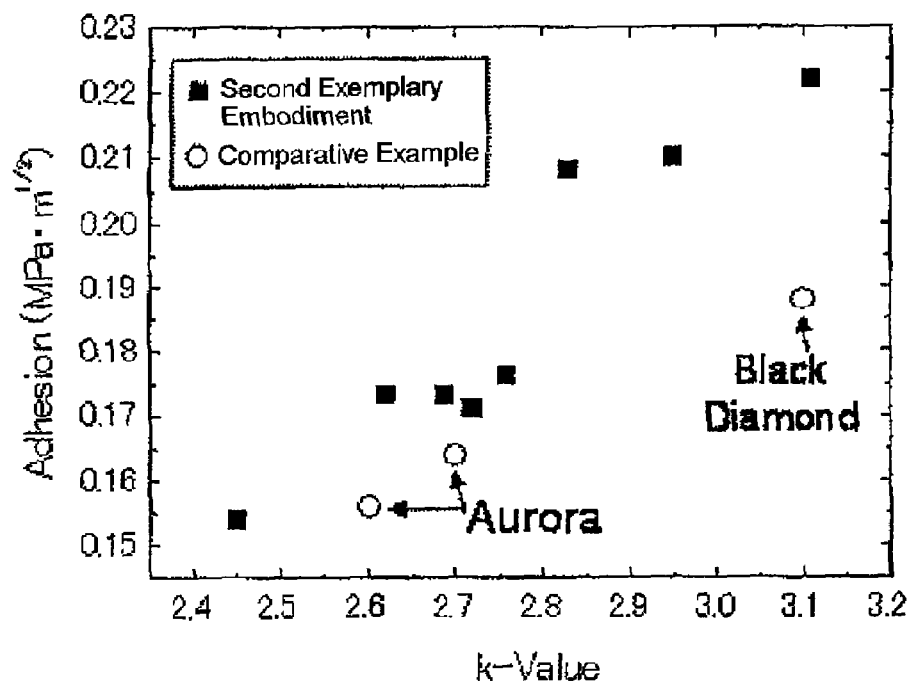
FIG. 8 is a graph showing the relationship of the k-value versus the adhesive strength in the second exemplary embodiment and comparative examples-1 and 2.

FIG. 7 shows the change of film strength versus the k-value, and FIG. 8 shows the adhesive strength (adhesion: MPa·m$^{1/2}$) versus the k-value. The square dot represents the present embodiment and blank circle represents the comparative example. For a lower k-value, there is no significant difference in the film strength between example-8 and the comparative example, whereas example-8 exhibited a higher adhesive strength. On the other hand, for a higher k-value, example-8 exhibited a higher film strength and a higher adhesive strength.

Figure 9:
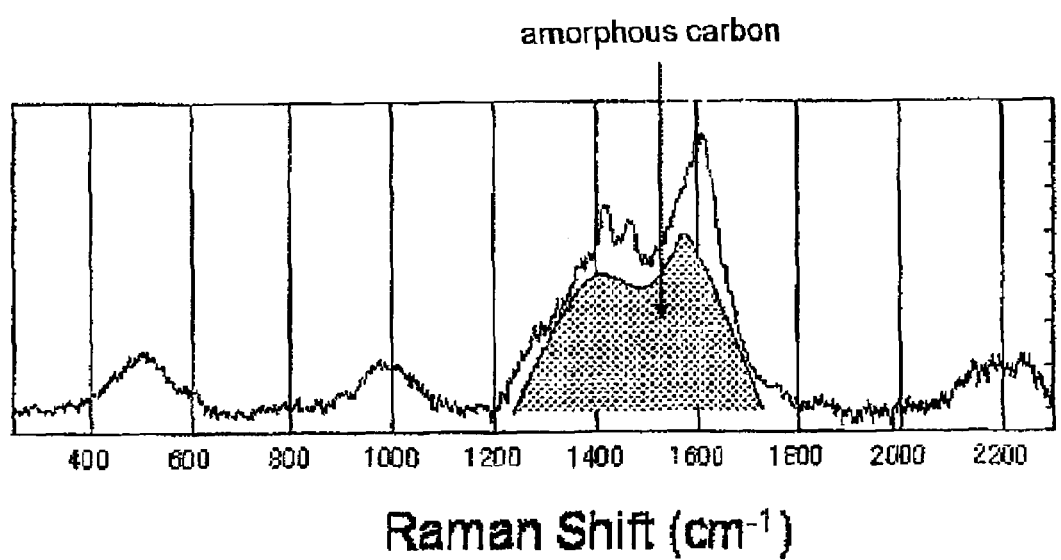
FIG. 9 is a graph showing results of Raman spectrometry of films according to the second exemplary embodiment.

Those films were subjected to the Raman spectroscopic analysis for evaluation thereof, which revealed peaks such as shown in FIG. 9. There are a broad peak deemed to result from amorphous carbon peak and peaks resulting from a double bond and hydrocarbon in the range of 1200 to 1600 cm$^{-1}$, and a peak resulting from polysiloxane in the vicinity of 500 cm$^{-1}$. The polysiloxane is such that Si—O structures are cross-linked together, and thus is considered here as a reason of the higher film strength. The peaks of amorphous carbon exist in the vicinity of 1400 cm$^{-1}$ and 1600 cm$^{-1}$, wherein the peak in the vicinity of 1400 cm$^{-1}$ is generally considered to originate from carbon having a Sp2 structure, and the peak in the vicinity of 1600 cm$^{-1}$ is generally considered to originate from carbon having a Sp3 structure. Since the Sp3 structure has a higher strength as typified by diamond, these films are considered to have a higher film strength and a higher adhesive strength. It is also possible to use EELS (electron energy loss spectroscopy) other than the Raman spectroscopic analysis for the Sp3 structure of carbon. Manufacture of such a hard amorphous carbon premises, in addition to the existence of a

TABLE 1

|  | Ex.-1 | Ex.-2 | Ex.-3 | Ex.-4 | Ex.-5 | Ex.-6 | Ex.-7 | C. Ex.-1 | C. Ex.-2 |
|---|---|---|---|---|---|---|---|---|---|
| First organic siloxane material | Formula 1 | Formula 1 | Formula 1 | Formula 1 | Formula 1 | Formula 1 | Formula 1 | Formula 1 | — |
| R1 | vinyl | vinyl | ethyl | vinyl | vinyl | vinyl | vinyl | vinyl | — |
| R2 | isopropyl | ethyl | isopropyl | n-butyl | isopropyl | isopropyl | isopropyl | isopropyl | — |
| Second organic siloxane material | Formula 6 | Formula 6 | Formula 6 | Formula 6 | Formula 6 | Formula 6 | Formula 6 | — | Formula 6 |
| R3 | vinyl | vinyl | vinyl | vinyl | vinyl | methylvinyl | vinyl | — | vinyl |
| R4 | methyl | methyl | methyl | methyl | hydrogen | hydrogen | methyl | — | butyl |
| Δk | Refer to FIG. 3 | 0.08 | 0.09 | 0.09 | 0.1 | 0.1 | 0.11 | — | — |
| Δ modulus (GPa) | Refer to FIG. 3 | 1 | 1.3 | 1.6 | 2 | 2.2 | 2.4 | — | — |

(Second Exemplary Embodiment)

This embodiment used a material having a 3-membered SiO cyclic structure in the feedstock tank 102 of evaporation control unit VU1, and a material having a straight-chain SiO structure in the feedstock tank 102 of evaporation control unit VU2 for the filming. The other conditions are similar to those in the first embodiment.

carbon atom on the side chain, the existence of hydrogen which is also important, and in particular it was found that the existence of methyl radicals in the plasma achieves the hard amorphous carbon. As a result of this fact, it was found that the improvement of film strength is obtained by the material having a straight-chain SiO structure achieving an atomic ratio of H/C≥1.6, C/Si≥5, and H/Si≥8.

EXAMPLE-9

The filming process used, as the first organic siloxane material 101, the material expressed by formula 1 (formula 2), wherein R1 is a vinyl group and R2 is a methyl group, and used, as the second organic siloxane material 103, the material expressed by formula 11 (formula 12) wherein R5 is a vinyl group, R6 is an isopropyl group, and R7 and R8 are a methyl group. The material ratio (molar ratio) of the first organic siloxane material to the second organic siloxane was 2:8.

EXAMPLE-10

The filming process used, as the first organic siloxane material 101, the material expressed by formula 1 (formula 4), wherein R1 is an ethyl group and R2 is an isopropyl group, and used, as the second organic siloxane material 103, the material expressed by formula 11 (formula 12) wherein R5 is a vinyl group, R6 is an isopropyl group, and R7 and R8 are a methyl group. The material ratio (molar ratio) of the first organic siloxane material to the second organic siloxane was 3:7.

EXAMPLE-11

The filming process used, as the first organic siloxane material 101, the material expressed by formula 1 (formula 5), wherein R1 is a vinyl group and R2 is an n-butyl group, and used, as the second organic siloxane material 103, the material expressed by formula 11 (formula 12) wherein R5 is a vinyl group, R6 is an isopropyl group, and R7 and R8 are a methyl group. The material ratio (molar ratio) of the first organic siloxane material to the second organic siloxane was 4:6.

COMPARATIVE EXAMPLE-3

In the comparative example, an Aurora™ film configuring a SiOCH film was formed, and the film strength and adhesion strength thereof were measured.

COMPARATIVE EXAMPLE-4

In the comparative example, a black diamond™ film configuring the SiOCH film was formed, and the film strength and adhesion strength thereof were measured.

Table 2 shows the film strength and adhesive strength increased as compared to the case (comparative example-1) of using only the first organic siloxane material 101, FIG. 7 shows the change of film strength versus the k-value, and FIG. 8 shows the adhesive strength versus the k-value. As compared to the comparative examples-3 and -4, use of the material having a 3-membered SiO structure and the material having a straight-chain SiO structure as in the case of example-8 to example-11 achieves a higher strength and a higher adhesive strength irrespective of having the same k-value.

TABLE 2

|  | Ex.-8 | Ex.-9 | Ex.-10 | Ex.-11 |
|---|---|---|---|---|
| First organic siloxane material | Formula 1 | Formula 1 | Formula 1 | Formula 1 |
| R1 | vinyl group | vinyl group | ethyl group | vinyl group |
| R2 | isopropyl group | methyl group | isopropyl group | n-butyl group |
| R3 | — | — | — | — |
| R4 | — | — | — | — |
| Second organic siloxane material | Formula 11 | Formula 11 | Formula 11 | Formula 11 |
| R7 | methyl group | methyl group | methyl group | methyl group |
| R8 | methyl group | methyl group | methyl group | methyl group |
| Δ modulus | Refer to FIG. 7 | 10 | 7.5 | 7 |
| Δ adhesion (MPa · $m^{1/2}$) | Refer to FIG. 8 | 0.055 | 0.03 | 0.03 |

(Third Exemplary Embodiment)

Now, the third embodiment of the present invention will be described. The conventional dual-damascene interconnection structure shown in FIG. 1A is such that a cap film (SiCN) 202, a low-dielectric-constant inter-via•layer film 203, an etch stop layer 204, a low-dielectric-constant interlevel film 205, a hard mask 206, and a cap film (SiCN) 207 are layered on an underlying interconnections 201. In addition, a via-hole formed in the low-dielectric-constant inter-via•layer film 203 and a wiring groove formed in the low-dielectric-constant interlevel film are provided with a barrier film 209 formed on the side wall thereof and copper 208 embedded therein. The dual-damascene interconnection structure shown in FIG. 1B is obtained by reducing the effective relative permittivity from that of the structure of FIG. 1A.

Figure 1B:
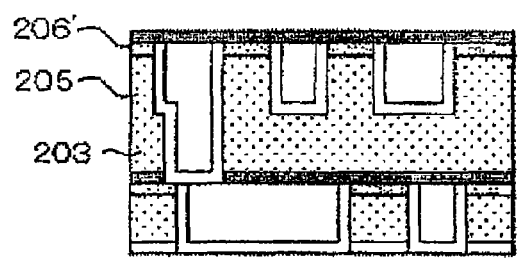

In the portion wherein the interlevel dielectric films such as shown in FIG. 1A and FIG. 1B are layered, if these films are continuously formed within the same system, improvement in a throughput, and avoidance of the influence by contamination or adsorption caused by release to atmosphere etc. will be achieved, whereby improvement of the adhesive strength between the films can be expected. In order to further reduce the effective dielectric constant in a device, a structure such as shown in FIG. 1B is adopted. In this structure, the etch stop layer 204 provided between the low-dielectric-constant inter-via•layer film 203 and the low-dielectric-constant interlevel film 205 is omitted, and a hard mask denoted by 206' is subjected to a treatment for reducing the dielectric constant thereof. Thus, the present exemplary embodiment provided a film configured from the first organic siloxane material 101 and second organic siloxane material 103 as the low-dielectric-constant inter-via•layer film 203, a film configured from the first organic siloxane material 101 as the low-dielectric-constant interlevel film 205, and a film configured from the second organic siloxane material 103 as the hard mask 206'.

EXAMPLE-12

The filming process used, as the first organic siloxane material 101, the material expressed by formula 1 (formula 3), wherein R1 is a vinyl group and R2 is an isopropyl group, and used, as the second organic siloxane material 103, the material expressed by formula 11 (formula 12) wherein R5 is a vinyl group, R6 is an isopropyl group, and R7 and R8 are a methyl group.

To begin with, the first organic siloxane material and second organic siloxane material are mixed together at a mixing ratio of 2:8, to form the low-dielectric-constant inter-via•layer film 203 in the chamber, followed by closing valves 110a and 118a of VU2 for stopping the feed of the second organic siloxane material, thereby forming the low-dielectric-constant interlevel film 205 by using only the first organic siloxane material 101. Subsequently, valves 110a and 118a of VU1 were closed for stopping the feed of the first organic siloxane material, thereby forming the hard mask 206' by using only the second organic siloxane material.

The detection of end point of the groove etching while omitting the etch stop layer 204 was performed by luminescence spectrum detecting the difference of the composition. During the groove etching, the interlevel dielectric films having different C/Si ratios were etched using $Ar/N_2/CF_4/O_2$-series gas, whereby the luminescence spectrum at 440 nm showing SiF changes. Monitor of this change provides detection of the end point. Since the change rate of a 440-nm spectrum per unit time is larger for a lower C/Si ratio, it is necessary to allow the low-dielectric-constant interlayer film to have a higher C/Si ratio and the low-dielectric-constant inter-via•layer film to have a lower C/Si ratio. In the present example, the low-dielectric-constant inter-via•layer film had a C/Si ratio of 1.2 whereas the low-dielectric-constant interlevel film had a C/Si ratio of 2.7, whereby the detection of end point can be well performed by the luminescence spectrum without using the etch stop layer. Thus, the present example was effective also in the view point of the etching process.

The device obtained by the present example exhibited an effective dielectric constant, keff, of 2.9 and thus below 3.

EXAMPLE-13

The filming process used, as the first organic siloxane material 101, the material expressed by formula 1 (formula 3) wherein R1 is a vinyl group and R2 is an isopropyl group, and used, as the second organic siloxane material 103, the material expressed by formula 6 (formula 7) wherein R3 is a vinyl group and R4 is a methyl group. The first organic siloxane material and second organic siloxane material were mixed together at a molar ratio of 3:7, followed by filming therefrom for forming the low-dielectric-constant inter-via•layer film 203 in the chamber, and closing the valves 110a and 118a of VU2 for stopping the feed of second organic siloxane group to use only the first organic siloxane material to form the low-dielectric-constant interlevel film 205. Thereafter, valves 110a and 118a of VU1 were closed to stop the feed of first organic siloxane material, thereby forming the hard mask 206' by using only the second organic siloxane material.

The device obtained by the present example exhibited an effective dielectric constant, keff, of 2.94 and thus below 3.

COMPARATIVE EXAMPLE-5

The comparative example-5 used Aurora for the low-dielectric-constant inter-via•layer film 203, $SiO_2$ for the etch stop layer 204, the first organic siloxane material for the low-dielectric-constant interlevel film 205, and $SiO_2$ for the hard mask 206' (refer to FIG. 1A).

The device obtained by the present example exhibited an effective dielectric constant, keff, of 3.24 and thus above 3. The cross-link reaction of the unsaturated carbon hydride provided a higher filming rate, and is expected to provide a higher throughput, similarly to the above described cases.

While the present invention has been described based on the preferred examples thereof, the method of forming the porous insulation film according to the present invention is not limited only to the configuration of the above examples, and a variety of modifications and alterations of the configuration of the above examples may fall within the scope of the present invention.

The invention claimed is:

1. A method of forming an insulation film, said method using plasma reaction of a gas of a plurality of species of materials each having a cyclic organic silica structure to form an organic silica film, wherein said plurality of species of materials include a first material having in a main skeletal frame thereof a 3-membered SiO cyclic structure and a second material having in a main skeletal frame thereof a 4-membered SiO cyclic structure, wherein each Si atom of said 3-membered SiO cyclic structure of said first material is modified by the same one unsaturated hydrocarbon group and the same one saturated hydrocarbon group, and each Si atom of said 4-membered SiO cyclic structure of said second material is modified by the same one unsaturated hydrocarbon group and the same one saturated hydrocarbon group, and wherein a molar ratio of said first material to said second material is from 1:9 to 8:2.

2. The method of forming an insulation film according to claim 1, wherein said first material and said second material are vaporized in different carburetors and introduced into a reaction chamber.

3. The method of forming insulation film according to claim 1, wherein said first material and said second material are vaporized in the same carburetor and introduced into a reaction chamber.

4. The method of forming an insulation film according to claim 1, wherein said first material includes a compound expressed by the following formula 1, wherein $R_1$ is a vinyl group, or allyl group, and $R_2$ is a methyl group, ethyl group, propyl group, isopropyl group, or butyl group,

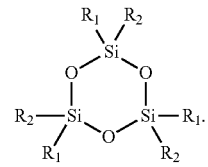

[Formula 1]

5. The method of forming an insulation film according to claim 1, wherein said first material includes at least one compound selected from a group consisting of compounds expressed by the following formulas 2, 3 and 5

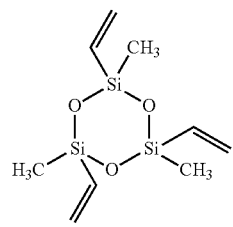

[Formula 2]

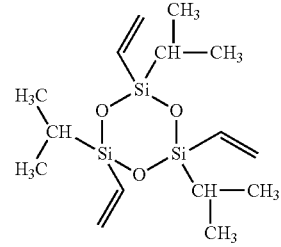

[Formula 3]

[Formula 5]

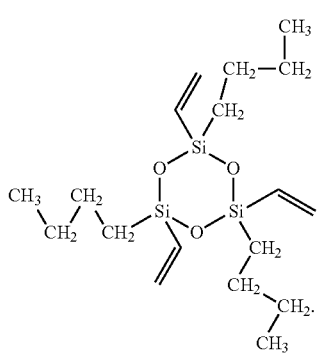

[Formula 9]

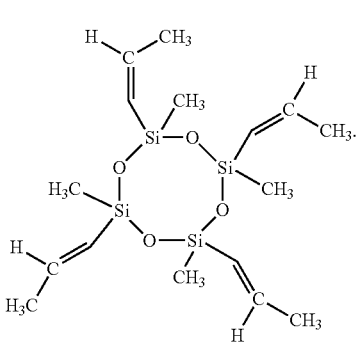

6. The method of forming an insulation film according to claim 1, wherein said second material includes a compound expressed by the following formula 6, wherein $R_3$ is a vinyl group, allyl group, or methylvinyl group, and $R_4$ is a methyl group, ethyl group, propyl group, isopropyl group, or butyl group,

[Formula 6]

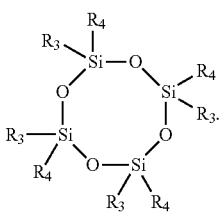

7. The method of forming an insulation film according to claim 1, wherein said second material includes at least one compound selected from a group consisting of compounds expressed by the following formulas 7 and 9,

[Formula 7]

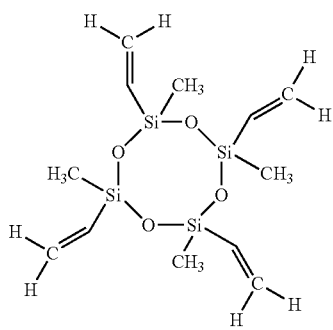

8. An insulation film manufactured by the method according to claim 1, wherein said insulation film includes therein at least amorphous carbon.

9. The semiconductor device comprising an insulation film according to claim 8, wherein said amorphous carbon included in said insulation film has both a Sp2 structure and a Sp3 structure.

10. The semiconductor device according to claim 8, wherein said insulation film includes at least two insulation layers formed from different ratios of said first material to second materials.

11. A method of forming an insulation film, said method using plasma reaction of a gas of at least one species of material having a cyclic organic silica structure and a gas of at least one species of material having a straight-chain organic silica structure to form an organic silica film, wherein said material having said organic cyclic silica structure includes a first material having a 3-membered SiO cyclic structure in a skeletal frame thereof, and said material having said straight-chain organic silica structure includes a second material having a straight-chain organic silica structure in a skeletal frame thereof, wherein each Si atom of said 3-membered SiO cyclic structure of said first material is modified by the same one unsaturated hydrocarbon group and the same one saturated hydrocarbon group, wherein said second material has a composition ratio of $H/C \geq 1.6$, $C/Si \geq 5$, $H/Si \geq 8$, and wherein said straight-chain organic silica of said second material is modified by the same side chains as present on Si atoms of said 3-membered SiO cyclic structure.

12. The method of forming an insulation film according to claim 2, wherein said second material includes a compound expressed by the following formula 11, wherein $R_5$ is a vinyl group or allyl group, and $R_6$, $R_7$ and $R_8$ are each independently a methyl group, ethyl group, propyl group, isopropyl group, or butyl group:

[Formula 11]

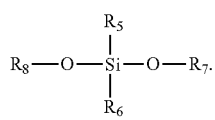

13. The method of forming an insulation film according to claim 2, wherein said second material includes a compound expressed by the following formula 12:

[Formula 12]

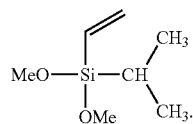

14. The method of forming an insulation film according to claim 2, wherein said first material and said second material are vaporized in different carburetors and introduced into a reaction chamber.

15. The method of forming insulation film according to claim 2, wherein said first material and said second material are vaporized in the same carburetor and introduced into a reaction chamber.

16. The method of forming an insulation film according to claim 2, wherein said first material includes a compound expressed by the following formula 1, wherein $R_1$ is a vinyl group or allyl group, and $R_2$ is a methyl group, ethyl group, propyl group, isopropyl group, or butyl group,

[Formula 1]

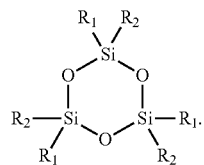

17. The method of forming an insulation film according to claim 2, wherein said first material includes at least one compound selected from a group consisting of compounds expressed by the following formulas 2, 3 and 5:

[Formula 2]

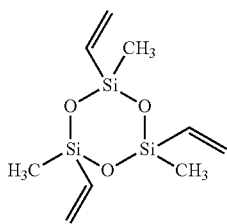

[Formula 3]

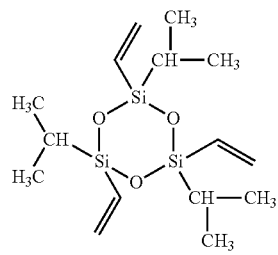

[Formula 5]

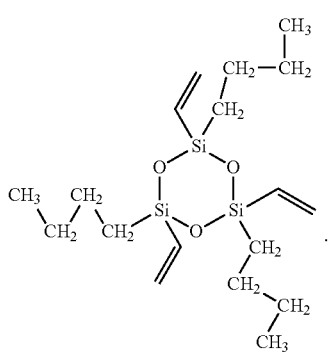

18. An insulation film manufactured by the method according to claim 2, wherein said insulation film includes therein at least amorphous carbon.

19. The semiconductor device comprising an insulation film according to claim 18, wherein said amorphous carbon included in said insulation film has both a Sp2 structure and a Sp3 structure.

20. The semiconductor device according to claim 18, wherein said insulation film includes at least two insulation layers formed from different ratios of said first material to second materials.

* * * * *